United States Patent [19]

Hyakutake

[11] Patent Number: 4,884,141
[45] Date of Patent: Nov. 28, 1989

[54] AUTOMATIC GAIN CONTROL CIRCUIT

[75] Inventor: Junichi Hyakutake, Itami, Japan

[73] Assignee: Mitsubishi Denki Kabushiki Kaisha, Tokyo, Japan

[21] Appl. No.: 300,977

[22] Filed: Jan. 24, 1989

[30] Foreign Application Priority Data

Jul. 27, 1988 [JP] Japan .................. 63-188818

[51] Int. Cl.$^4$ .................. H04N 5/52; H04N 9/64
[52] U.S. Cl. .................. 358/174; 358/27; 455/239; 330/281
[58] Field of Search .................. 358/27, 174, 177, 176; 455/234, 239, 246; 375/98; 330/279, 281

[56] References Cited

U.S. PATENT DOCUMENTS

| | | | |
|---|---|---|---|
| 3,624,290 | 11/1971 | Hofmann | 358/177 |
| 3,898,380 | 8/1975 | Wilcox | 358/177 |
| 4,292,598 | 9/1981 | Yasumura | 330/281 |
| 4,300,104 | 11/1981 | Tanaka et al. | 330/281 |
| 4,371,842 | 2/1983 | Lee | 330/281 |
| 4,433,304 | 2/1984 | Engle | 330/281 |
| 4,807,035 | 2/1989 | Sayliss | 358/174 |

Primary Examiner—John K. Peng
Attorney, Agent, or Firm—Oblon, Spivak, McClelland, Maier & Neustadt

[57] ABSTRACT

The gain of a video intermediate frequency signal processing circuit (11) is varied in accordance with the charge voltage of a capacitor ($C_1$). The capacitor ($C_1$) is charged with a relatively small current when the peak of a video detection signal does not reach a reference voltage ($V_A$) and discharged with a relatively large current when reaches. A current source (29) for rapid charge is activated when the peak of the video detection signal does not reach the reference voltage ($V_A$) over a predetermined period longer than one horizontal synchronous period, to rapidly charge the capacitor ($C_1$). Thus, a speed in increase of the gain of the video intermediate frequency signal processing circuit is quickened, to hasten the restoration of an amplitude of the video detection signal.

6 Claims, 5 Drawing Sheets

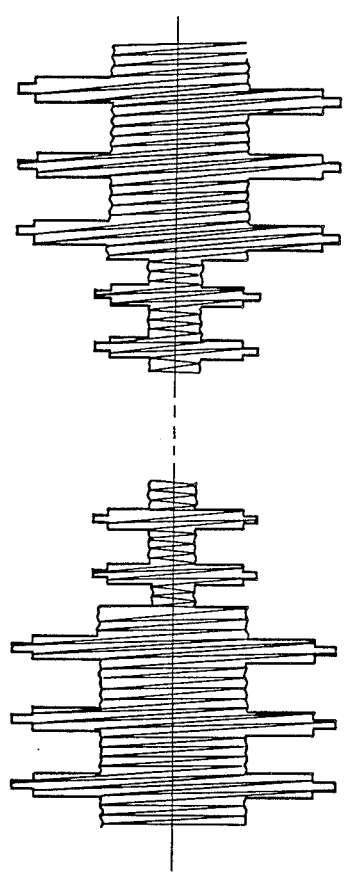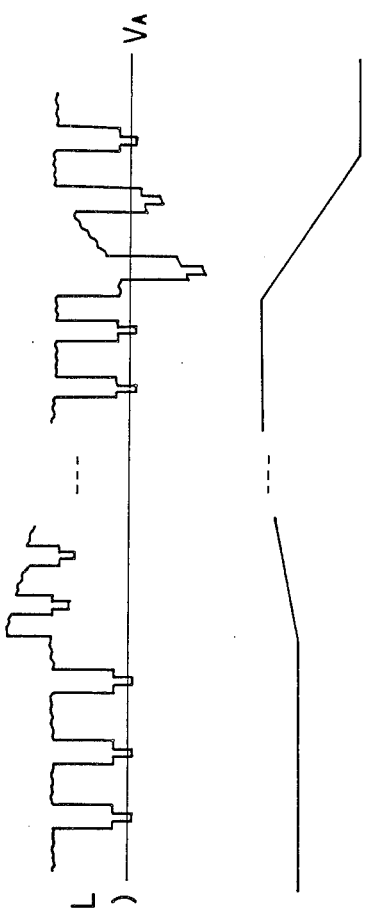
FIG. 3A (PRIOR ART) VIDEO INTERMEDIATE FREQUENCY SIGNAL
FIG. 3B (PRIOR ART) VIDEO DETECTION SIGNAL (VOLTAGE $V_1$)
FIG. 3C (PRIOR ART) VOLTAGE $V_2$

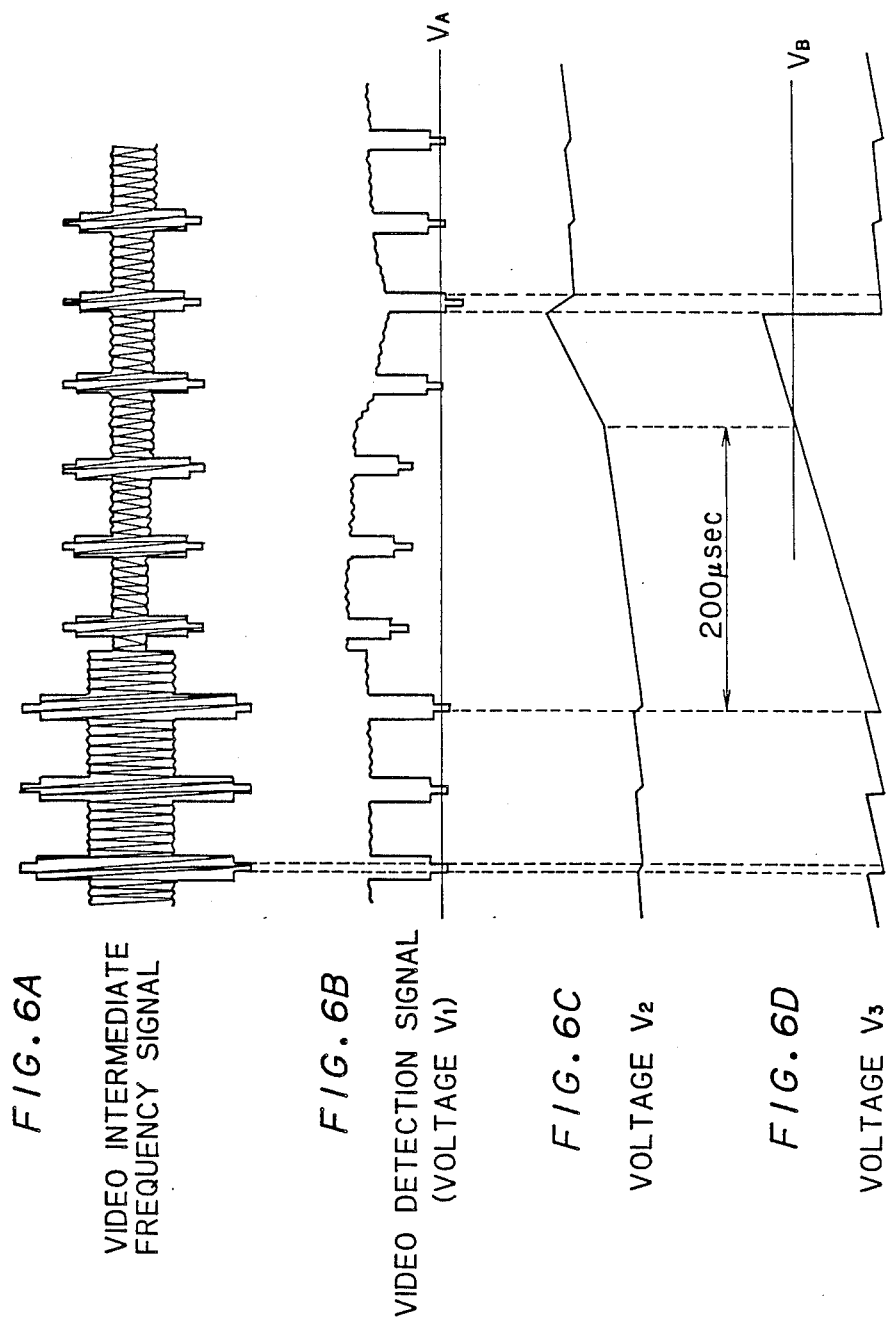

AUTOMATIC GAIN CONTROL CIRCUIT

BACKGROUND OF THE INVENTION

1. Field of the Invention

The present invention relates to an automatic gain control circuit (hereinafter referred to as an AGC circuit) for use in a television receiver and a video tape recorder and, more particularly, to a peak AGC circuit.

2. Description of the Prior Art

As is well known in the art, an AGC circuit is used for always keeping a video detection signal outputted from a video intermediate frequency signal processing circuit at a constant level despite the variation of an input level, by automatically changing the gain of the video intermediate frequency signal processing circuit or a tuner. Various types of AGC circuits such as a mean AGC circuit, a peak AGC circuit and a keyed AGC circuit are known, as described in detail in the document" Circuit Design of Television Receiver, Rajio-Gijutsu-sha, Japan, 1968, pp. 181–187" and "Television and Image Technology Handbook, Ohm-sha, Japan, 1977, pp. 982–984". Of these types of AGC circuits, the peak AGC circuit is mainly used in recent years.

FIG. 1 is a circuit diagram showing an example of the conventional peak AGC circuit. Referring to FIG. 1, a video intermediate frequency signal processing circuit 11 includes a variable gain amplifier 12 and an amplitude demodulation circuit 13. A video intermediate frequency signal supplied to an input terminal 14 from a turner (not shown) is amplified by the variable gain amplifier 12, detected by the amplitude demodulation circuit 13 and then outputted from an output terminal 15 as a video detection signal. An AGC circuit 16 includes a differential amplifier 17 comprising transistors $Q_1$ and $Q_2$. The base of the transistor $Q_1$ is supplied with the video detection signal outputted from the video intermediate frequency signal processing circuit 11 and the base of the transistor $Q_2$ is supplied with a reference voltage $V_A$.

When the voltage $V_1$ (voltage of synchronous negative polarity in this example) of the video detection signal is greater than the reference voltage $V_A$, the transistor $Q_1$ is in a conduction state. As a result, a current mirror circuit consisting of transistors $Q_3$ and $Q_6$ is activated and a current mirror circuit consisting of transistors $Q_4$ and $Q_5$ and a current mirror circuit consisting of transistors $Q_7$ and $Q_8$ are inactivated. Assuming that the current of a constant current source 18 is $I_1$, a current of $I_1/50$ is supplied to a capacitor $C_1$ from the collector of the transistor $Q_6$, in the case of $R_4 = 50R_1$. Thus, the capacitor $C_1$ is slowly charged so that the charge voltage $V_2$ thereof is gradually increased.

On the other hand, when the voltage $V_1$ of the video detection signal is smaller than the reference voltage $V_A$, the transistor $Q_2$ is in a conduction state and the transistor $Q_1$ is in nonconduction of the transistors $Q_4$ and $Q_5$ and the current mirror circuit consisting of the transistors $Q_7$ and $Q_8$ are activated and the current mirror circuit consisting of the transistors $Q_3$ and $Q_6$ is inactivated. Assuming that $R_1 = R_2 = R_3$ and $R_5 = R_6$, a current of $I_1$ is supplied to the collector of the transistor $Q_8$ from the capacitor $C_1$. Thus, the capacitor $C_1$ is rapidly discharged at a speed of fifty times as large as the case of increase.

FIG. 2A and FIG. 2B are diagrams showing changes of the voltage $V_1$ of the video detection signal and the charge voltage $V_2$ of the capacitor $C_1$. Peaks of the video detection signal appear at points of a synchronous signal. The circuit shown in FIG. 1 is in a stationary state when a period of $V_1 < V_A$, i.e., a period when the peak of the video detection signal crosses the reference voltage $V_A$, is approximately one fiftieth of a period of $V_1 > V_A$.

The charge voltage $V_2$ of the capacitor $C_1$ is received by the variable gain amplifier 12 as a control signal. The gain of the variable gain amplifier 12 is increased in response to the increase of the voltage $V_2$ and decreased in response to the decrease of the voltage $V_2$. Thus, the video detection signal outputted from the output terminal 15 is maintained at a constant level defined by the reference voltage $V_A$, in spite of the level variation of the video intermediate frequency signal received at the input terminal 14. FIG. 3A to FIG. 3C are digrams showing such operation. If the level of the video intermediate frequency signal inputted suddenly becomes small, the level of the video detection signal outputted also becomes small in excess, so that the voltage $V_1$ of a synchronous negative polarity of the video detection signal becomes much larger than the reference voltage $V_A$. As a result, the charge voltage $V_2$ of the capacitor $C_1$ is slowly increased, to gradually increase the gain of the variable gain amplifier 12. In response to this, the peak of the voltage $V_1$ of the video detection signal, i.e., the top of the synchronous signal, gradually approaches the reference voltage $V_A$. When the top of the synchronous signal crosses the reference voltage $V_A$ a little bit (the stage shown in FIG. 2A), the stationary state is entered. If the level of the video intermediate frequency signal suddenly becomes large, the stationary state is entered through the operation opposite to the above. In this operation, the transition speed is approximately fifty times as fast as that of the above operation.

In the hereinbefore described conventional AGC circuit, increase of the capacitance of the capacitor $C_1$ results in increase of stability to noise of the video detection signal since variation of the voltage $V_2$ and therefore variation of the gain of the variable gain amplifier 12 are decreased. However, the response speed of the AGC circuit is decreased. On the other hand, if the capacitance of the capacitor $C_1$ is decreased, the response speed of the AGC circuit is increased but the stability of a wave form of the video detection signal outputted is damaged. Many attempts are made in order to satisfy both the stability of the output waveform and the high speed of response by making the circuit structure of a filter circuit consisting the capacitor $C_1$ further complicated. However, such attempts do not well succeed for the present.

SUMMARY OF THE INVENTION

An automatic gain control circuit in accordance with the present invention comprises an input means for inputting a video intermediate frequency signal, a video intermediate frequency signal processing circuit connected to the input means for amplifying and detecting the video intermediate frequency signal to output a video detection signal, a decision circuit connected to the video intermediate frequency signal processing circuit for deciding whether a peak of an amplitude of the video detection signal reaches a predetermined reference value or not to output a first output when reaches and a second output when does not reach, a gain control circuit connected to the decision circuit and the video intermediate frequency signal processing circuit for decreasing a gain of the video intermediate frequency signal processing circuit at a relatively fast first speed in response to the first output and increasing the gain of the video intermediate frequency signal processing circuit at a relatively slow second speed in response to the second output, and a gain variation speed changing circuit connected to the decision circuit and the gain control circuit for changing the second speed in the gain control circuit into a third speed faster than the second speed when the first output is not outputted from the decision circuit for a predetermined period longer than one horizontal period.

According to the present invention, the gain variation speed changing circuit hastens the restoration of an amplitude of the video detection signal by quickening the increase speed of a gain of the video intermediate frequency signal processing circuit when the peak of the video detection signal does not reach a reference value over a predetermined period longer than one horizontal synchronous period because of excessive attenuation of the video detection signal.

Accordingly, it is an object of the present invention to provide an automatic gain control circuit which easily satisfies both the stability of an output waveform and the high speed of response.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2A and FIG. 2B and FIG. 3A to FIG. 3C are diagrams showing waveforms in the operation of the automatic gain control circuit shown in FIG. 1;

FIG. 6A to FIG. 6D are diagrams showing wave forms in the operation of the automatic gain control circuits shown in FIG. 4 and FIG. 5.

DETAILED DESCRIPTION OF THE EMBODIMENTS

Figure 4:
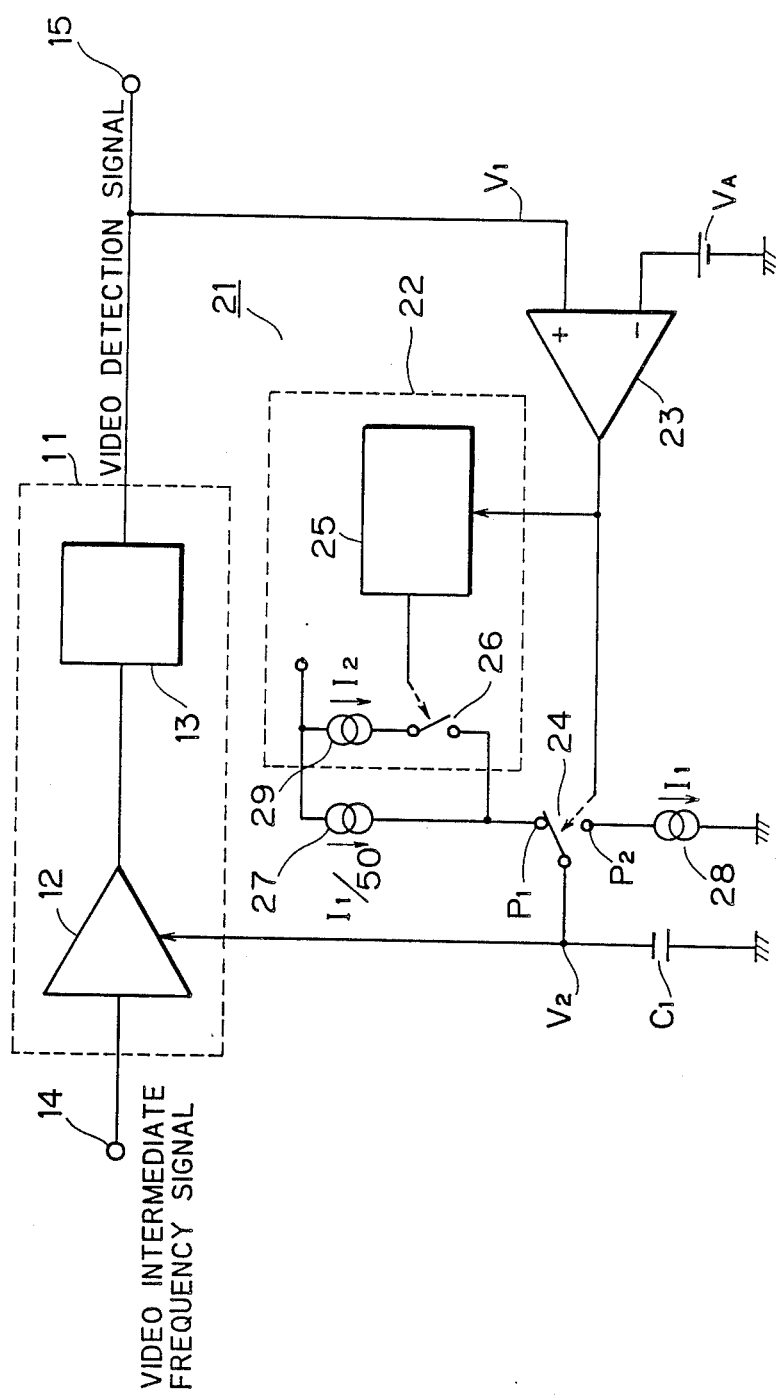
FIG. 4 is a block diagram showing an embodiment of an automatic gain control circuit in accordance with the present invention.

FIG. 4 is a block diagram showing an embodiment of an automatic gain control circuit in accordance with the present invention. Referring to FIG. 4, a video intermediate frequency signal processing circuit 11 includes a variable gain amplifier 12 and an amplitude demodulation circuit 13. A video intermediate frequency signal supplied to an input terminal 14 from a turner (not shown) is amplified by the variable gain amplifier 12, detected by the amplitude demodulation circuit 13 and then outputted as a video detection signal from an output terminal 15.

An AGC circuit 21 according to this embodiment includes a rapid charge circuit 22 for rapidly charging a capacitor $C_1$. The function of circuit parts other than the rapid charge circuit 22 is substantially the same as that of the conventional AGC circuit 16 shown in FIG. 1.

The video detection signal outputted from the video intermediate frequency signal processing circuit 11 is received by the positive input of a voltage comparator 23. The negative input of the voltage comparator 23 receives a reference voltage $V_A$. The voltage comparator 23 outputs a positive signal when the voltage $V_1$ (voltage of synchronous negative polarity in this embodiment) of the video detection signal is larger than the reference voltage $V_A$ and a negative signal when the voltage $V_1$ is smaller than the reference voltage $V_A$. This output signal of the voltage comparator 23 is received by a switching circuit 24 and a retriggerable monostable multivibrator 25 in the rapid charge circuit 22.

The switching circuit 24 is switched to a contact $P_1$ when the output signal of the voltage comparator 23 is positive, and to a contact $P_2$ when negative. Thus, the capacitor $C_1$ is greater than the reference voltage $V_A$ and discharged when smaller.

Figure 2A:
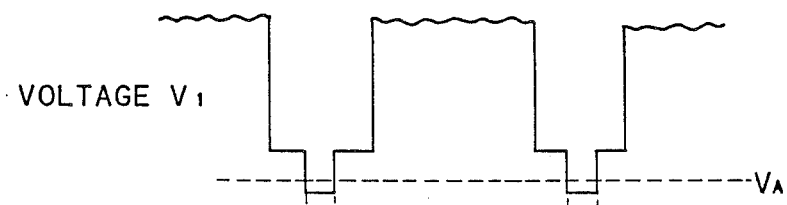
Figure 2B:
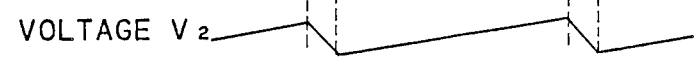

In a stationary state (see FIG. 2A), the output signal of the voltage comparator 23 has a pulse wave form which becomes negative in a short period corresponding to the top of a synchronous signal included in the video detection signal. The retriggerable monostable multivibrator 25 is triggered with this negative pulse to output a signal which is in a high level during 200 μsec. after the triggering. If the retriggerable monostable multivibrator 25 is retriggered before the passage of 200 μsec., the output signal of the retriggerable monostable multivibrator 25 is maintained in a high level during 200 μsec. after the retriggering. Since the period of a horizontal synchronous signal is 63 μsec., the retriggerable monostable multivibrator 25 is ordinarily triggered every 63 μsec. Therefore, the output signal of the retriggerable monostable multivibrator 25 is kept in a high level in a stationary state. This output signal becomes low level when the voltage level of a top of the synchronous signal included in the video detection signal keeps higher than the reference voltage $V_A$ over three periods of the horizontal synchronous signal (see FIG. 6B). In other words, the output signal of the retriggerable monostable multivibrator 25 is inverted to a low level from a high level only when the excessive amplitude attenuation of the video detection signal is caused.

The output signal of the retriggerable monostable multivibrator 25 is received by the switching circuit 26 which is kept in an OFF state in response to the high level of the output signal of the retriggerable monostable multivibrator 25 and in an ON state in response to the low level. Since the switching circuit 26 is ordinarily in an OFF state, the capacitor $C_1$ is supplied with a charging current through a constant current source 27. Assuming that the current value of a constant current source 28 defining a discharging current of the capacitor $C_1$ is $I_1$, the current value of the current source 27 is set at $I_1/50$ similar to the conventional case as hereinbefore described. Thus, an automatic gain control operation similar to that of the conventional AGC circuit shown in FIG. 4 is preferred until the output signal of the retriggerable monostable multivibrator 25 is inverted to a low level due to the excessive attenuation of the amplitude of the video detection signal.

If the amplitude of the video intermediate frequency signal supplied to the input terminal 14 is excessively attenuated as shown in FIG. 6A, the amplitude of the video detection signal outputted to the output terminal 15 is also greatly attenuated as shown in FIG. 6B. The charge voltage $V_2$ of the capacitor $C_1$ is slowly increased through the automatic gain control operation, similar to the conventional case, of the AGC circuit 21, so that the gain of the variable gain amplifier 12 is gradually increased. As a result, the amplitude of the video detection signal is gradually restored. If the voltage level of the top of the horizontal synchronous signal contained in the video detection signal does not yet reach the reference voltage $V_A$ after passage of 200 μsec. in spite of the restoration of the amplitude of the video detection signal, the output signal of the retriggerable monostable multivibrator 25 is inverted to a low level form a high level.

The switching circuit 26 is turned ON in response to this low level signal, and hence the capacitor $C_1$ is supplied with a charging current from a constant current source 29 in addition to the constant current source 27. Thus, the charge voltage $V_2$ of the capacitor $C_1$ is rapidly increased so that the gain of the variable gain amplifier 12 is also rapidly increased. As a result, the amplitude of the video detection signal is quickly restored. When the top of the horizontal synchronous signal included in the video detection signal acrosses the reference voltage $V_A$, a negative pulse signal is outputted from the voltage comparator 23. In response to this, the retriggerable monostable multivibrator 25 is triggered and the switching circuit 24 is switched to the contact $P_2$ during the negative pulse. Thus, the capacitor $C_1$ is somewhat discharged to decrease the charge voltage $V_2$ thereof, whereby over increase of the gain of the variable gain amplifier 12 is corrected. Thus, a stationary state is entered. If this over increase of the gain of variable gain amplifier 12 is excessive, it is corrected for a plurality of horizontal periods. In general, it is expected that an AGC speed including the above correction operation of an overshooting becomes the fastest when the current value $I_2$ of the constant current source 29 for rapid charge is approximately equal to the current value $I_1$ of the constant current source 28 for discharge.

According to the above embodiment, an increase speed of the gain of the variable gain amplifier 12 is hastened by the rapid charge circuit 22 when the peak (i.e., the top of the horizontal synchronous signal) of the video detection signal does not reach the reference voltage $V_A$ because of the excessive attenuation of the video detection signal. As a result, restoration of the amplitude of the video detection signal is extremely hastened. Therefore, even if the capacitance of the capacitor $C_1$ is increased in order to stabilize an output waveform, this does not result in a disadvantage of decrease of a response speed.

Figure 5:
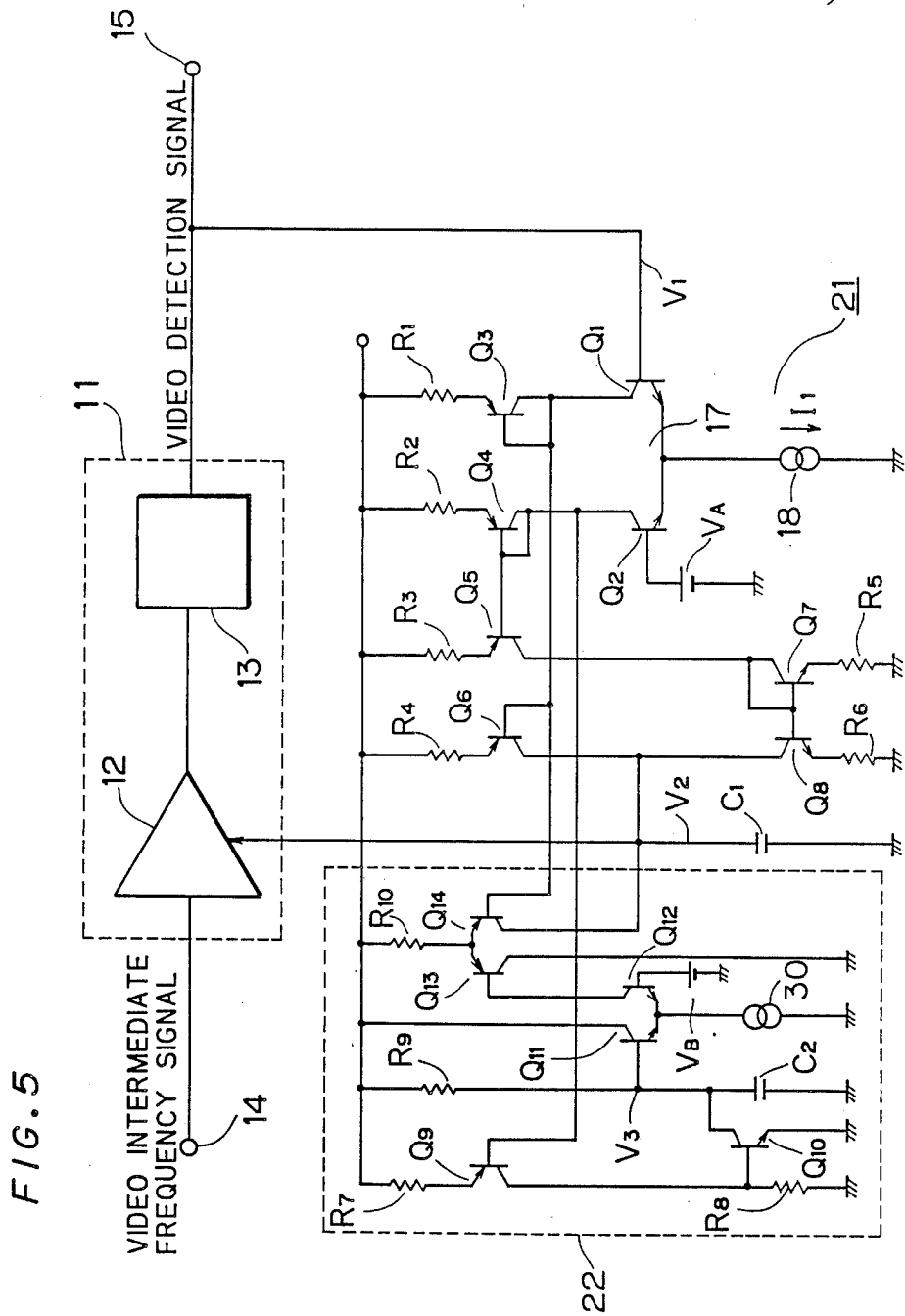
FIG. 5 is a circuit diagram showing an example of a circuit structure in the case where the automatic gain control circuit according to the present invention is integrated.

FIG. 5 is a circuit diagram showing an example of a circuit structure in the case where the AGC circuit 21 shown in FIG. 4 is integrated. Structures of circuit parts other than a rapid charge circuit 22 are the same as those of the conventional AGC circuit 16 shown in FIG. 1. Referring to FIG. 5, a differential amplifier 17 consisting of transistors $Q_1$ and $Q_2$ corresponding to the voltage comparator 23 and the switching circuit 24 shown in FIG. 4, and a current mirror circuit consisting of transistors $Q_3$ and $Q_6$, resistors $R_1$ and $R_4$ and a constant current source 18 correspond to the constant current source 27 for normal charge shown in FIG. 4. A current mirror circuit consisting of transistors $Q_4$ and $Q_5$, resistors $R_2$ and $R_3$, a current mirror circuit consisting of transistors $Q_7$ and $Q_8$ and the constant current source 18 correspond to the constant current source 27 for discharge shown in FIG. 3. This circuit is so structured that charging and discharging current values of a capacitor C are $I_1$ and $I_1/50$, respectively, in an operation of a stationary stage, by setting the current value of the constant current source 18 to $I_1$ and resistances of resistors as $R_1 = R_2 = R_3$, $R_4 = 50R_1$ and $R_5 = R_6$.

In the rapid charge circuit 22 shown in FIG. 5, the function of the retriggerable monostable multivibrator 25 shown in FIG. 4 is accomplished by transistors $Q_9$ and $Q_{10}$, resistors $R_7$ to $R_9$, a capacitor $C_2$, a differential amplifier consisting of transistors $Q_{11}$ and $Q_{12}$ and a reference voltage $V_B$. That is, the transistor $Q_2$ of the differential amplifier 17 is turned ON when the voltage $V_1$ of a video detection signal reaches (i.e., becomes smaller than) a reference voltage $V_A$ at the top of a horizontal synchronous signal, and hence the transistors $Q_9$ and $Q_{10}$ are responsively turned ON. In response to this, the capacitor $C_2$ is instantly discharged to be reset to a initial state. Then, the transistors $Q_2$, $Q_9$ and $Q_{10}$ are turned OFF when the voltage $V_1$ of the video detection signal becomes larger than the reference voltage $V_A$, so that the capacitor $C_2$ is charged in a time constant defined by the capacitance of the capacitor $C_2$ and the resistance of the resistor $R_9$. This time constant is so set that the charge voltage $V_3$ of the capacitor $C_2$ becomes equal to the reference voltage $V_B$ when 200 μsec. pass.

In a stationary state, the charge voltage $V_3$ of the capacitor $C_2$ never reach the reference voltage $V_B$, since the capacitor $C_2$ is reset every 63 μsec. by the reason that the peak of the horizontal synchronous signal included in the video detection signal acrosses the reference voltage $V_A$ every 63 μsec. However, if the amplitude of the video intermediate frequency signal is attenuated in excess as shown in FIG. 6A, the capacitor $C_2$ is continuously charged without being reset since the voltage $V_1$ of the video detection signal does not across the reference voltage $V_A$ over many periods of the horizontal synchronous signal, as shown in FIG. 6B. As a result, the charge voltage $V_3$ of the capacitor $C_2$ continue to increase. When 200 μsec. pass, the charge voltage $V_3$ of the capacitor $C_2$ exceeds the reference voltage $V_B$ so that the transistor $Q_{11}$ is responsively inverted to a conductive state from a nonconductive state and the transistor $Q_{12}$ is responsively inverted to a nonconductive state from a conductive state.

In response to this, the current of the constant current source 30, which have flown through the transistor $Q_{12}$, begins to flow through the transistor $Q_{11}$, and hence the transistor $Q_{13}$ is inverted to a nonconductive state from a conductive state and the transistor $Q_{14}$ is inverted to a conductive state from a nonconductive state. By setting resistances as $R_{10} = R_1$ in a current mirror circuit comprising transistors $Q_{14}$ and $Q_3$, a current equal to the current $I_1$ of the constant current source 18 is supplied to the capacitor $C_1$ from the collector of the transistor $Q_{14}$. Thus, the capacitor $C_1$ is rapidly charged with this current of $I_1$ as well as the current of $I_1/50$ supplied from the collector of the transistor $Q_6$. When the peak of the horizontal synchronous signal included in the video detection signal crosses the reference voltage $V_A$ due to the quick increase of the gain of the variable gain amplifier 12, the transistors $Q_2$, $Q_9$ and $Q_{10}$ is turned ON to reset the capacitor $C_2$ so that the charge voltage $V_3$ of the capacitor $C_2$ instantly lowers to 0 V. After this, an automatic gain control operation in a stationary state is performed.

Although a waiting time for entering the rapid charge operation is set to 200 μsec. in the above embodiment, this waiting time may be over one horizontal period (63

μsec.) and is not required to be so exactly set. Therefore, the capacitor $C_2$ is not required to be high in precision and the capacitance thereof to be required may be only several ten pF, resulting in easy integration of the rapid charge circuit 22.

Figure 1:
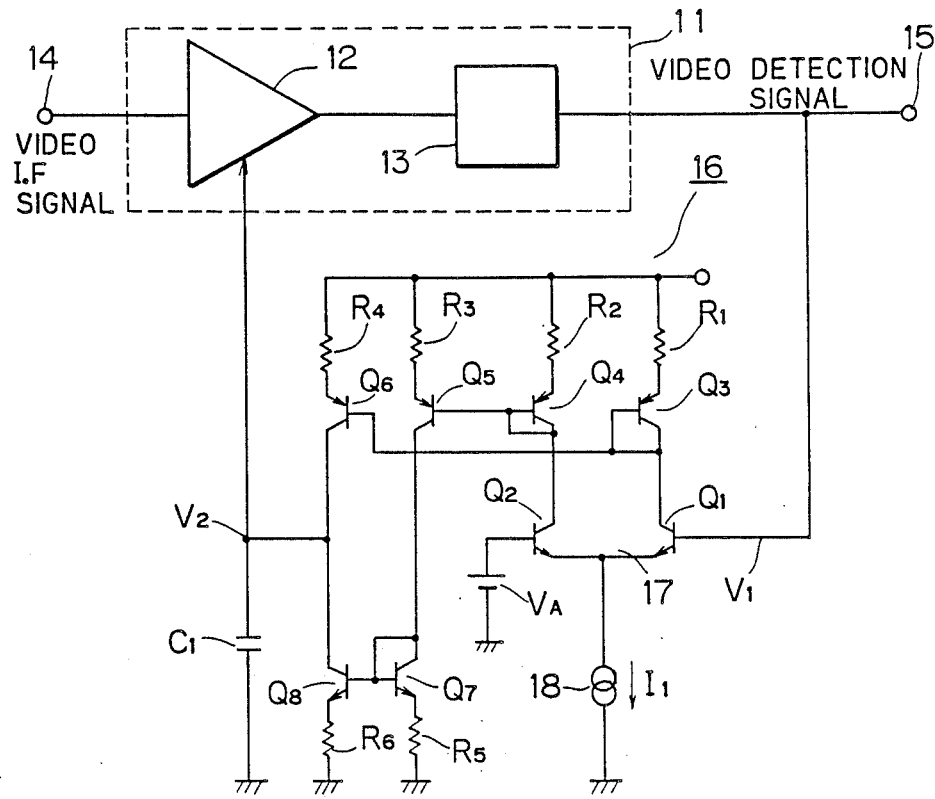
FIG. 1 is a circuit diagram showing a conventional automatic gain control circuit.

It is noted that addition of only the rapid charge circuit 22 of relatively simple circuit structure is required, by comparing the AGC circuit 21 according to the above embodiment with the conventional AGC circuit 16 shown in FIG. 1. Further, integration of the whole AGC circuit can be accomplished without increase of external parts and external terminals. As to the capacitor $C_1$, it must be externally provided in eighter circuits of the above embodiment and the prior art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An automatic gain control circuit, comprising:
   an input means for inputting a video intermediate frequency signal;
   a video intermediate frequency signal processing circuit connected to said input means, for amplifying and detecting said video intermediate frequency signal to output a video detection signal;
   a decision circuit connected to said video intermediate frequency signal processing circuit, for deciding whether a peak of an amplitude of said video detection signal reaches a predetermined reference value or not to output a first output when reaches and a second output when does not reach;
   a gain control circuit connected to said decision circuit and said video intermediate frequency signal processing circuit, for decreasing a gain of said video intermediate frequency signal processing circuit at a relatively fast first speed in response to said first output and increasing the gain of said video intermediate frequency signal processing circuit at a relatively slow second speed in response to said second output; and
   a gain variation speed changing circuit connected to said decision circuit and said gain control circuit, for changing said second speed in said gain control circuit into a third speed faster than said second speed when said first output is not outputted from said decision circuit for a predetermined period longer than one horizontal period.

2. An automatic gain control circuit in accordance with claim 1, wherein
   said video intermediate frequency signal processing circuit comprises;
   variable gain amplifier connected to said input means and having a control input for receiving a control signal, for amplifying said video intermediate frequency signal in an amplification factor according to said control signal to output an amplified signal and
   an amplitude demodulation circuit connected to said variable gain amplifier, for detecting said amplified signal to output said video detection signal.

3. An amplitude gain control circuit in accordance with claim 2, wherein
   said decision circuit comprises;
   a reference voltage source for generating a reference voltage corresponding to said predetermined reference value, and
   a voltage comparator connected to said amplitude demodulation circuit and said reference voltage source, for comparing said video detection signal with said reference voltage to output said first output when the peak of said video detection signal reaches said reference voltage and said second output when does not reach.

4. An automatic gain control circuit in accordance with claim 2, wherein
   said gain control circuit comprises;
   a capacitor connected to said control input of said variable gain amplifier, a charge voltage of said capacitor being applied to said control input as said control signal,
   a first constant current source coupled to said capacitor and said decision circuit, for charging said capacitor with a relatively small current, said first constant current source bing activated in response to said second output of said decision circuit, and
   a second constant current source coupled to said capacitor and said decision circuit, for discharging said capacitor with a relatively large current, said second constant current source being activated in response to said first output of said decision circuit.

5. An automatic gain control circuit in accordance with claim 4, wherein
   said gain variation speed changing circuit comprises;
   a detecting circuit connected to said decision circuit, for detecting when there is not said first output of said decision circuit over said predetermined period to output an activating signal, and
   a third constant current source coupled to said capacitor and said detecting circuit, for charging said capacitor with a predetermined current by being activated in response to said activating signal of said detecting circuit.

6. An automatic gain control circuit in accordance with claim 5, wherein
   said detecting circuit includes a retriggerable monostable multivibrator which is connected to said decision circuit and triggered with said first output of said decision circuit,
   said retriggerable monostable multivibrator outputting said activating signal when not triggered over said predetermined period.

* * * * *